(12) United States Patent
Hsiao et al.

(10) Patent No.: US 7,759,979 B2
(45) Date of Patent: Jul. 20, 2010

(54) GATE DRIVING CIRCUIT

(75) Inventors: Chao-Chih Hsiao, Taipei (TW); Yen-Po Chen, Hsinchu (TW)

(73) Assignee: NOVATEK Microelectronics Corp., Hsinchu Science Park, Hsin-Chu (TW)

( * ) Notice: Subject to any disclaimer, the term of this patent is extended or adjusted under 35 U.S.C. 154(b) by 0 days.

(21) Appl. No.: 12/264,187

(22) Filed: Nov. 3, 2008

(65) Prior Publication Data
US 2010/0033225 A1 Feb. 11, 2010

(30) Foreign Application Priority Data
Aug. 6, 2008 (TW) .............................. 97129882 A

(51) Int. Cl.
*H01L 25/00* (2006.01)
*H03K 19/00* (2006.01)
(52) U.S. Cl. ...................................... 326/101; 257/206
(58) Field of Classification Search ................. 326/101; 257/202–206
See application file for complete search history.

(56) References Cited

U.S. PATENT DOCUMENTS

2009/0244989 A1* 10/2009 Chia et al. ............. 365/189.06

* cited by examiner

*Primary Examiner*—Rexford N Barnie
*Assistant Examiner*—Jany Tran
(74) *Attorney, Agent, or Firm*—Winston Hsu

(57) ABSTRACT

A gate driving circuit includes a first output buffer unit region, a level shifter region and a low voltage circuit region. The first output buffer unit region is formed on a plane and is utilized for setting a first output buffer unit. The level shifter region is formed on the plane for setting a level shifter, and includes a vertical region and a horizontal region connected to the vertical region. The vertical region and the first output buffer unit region are aligned in a horizontal direction of the plane. The horizontal region is beneath the vertical region and the first output buffer unit region. The low voltage circuit region is formed on the plane for setting a low voltage circuit, and is beneath the horizontal region. The low voltage circuit region and the horizontal region are aligned in a vertical direction of the plane.

14 Claims, 6 Drawing Sheets

GATE DRIVING CIRCUIT

BACKGROUND OF THE INVENTION

1. Field of the Invention

The present invention relates to a gate driving circuit, and more particularly, to a gate driving circuit for driving thin film transistors of a LCD.

2. Description of the Prior Art

CRT monitors are replaced by LCD monitors nowadays just like those days when tapes were replaced by compact discs. A driving chip for driving a LCD monitor generally includes a source driver chip, a gate driver chip and a timing controller chip. The source driver is also called a data driver, and the gate driver is also called a scan driver.

Please refer to FIG. 1, which is a schematic diagram of a single channel layout 10 of a gate driver chip according to the prior art. The single channel layout 10 includes an output buffer region 10, a level shifter region 12 and a low voltage circuit region 14, which are stacked vertically. The level shifter is utilized for transforming signals outputted by the low voltage circuit from low-voltage level into high-voltage level, and outputting the signals transformed to the output buffer. Then, the output buffer outputs the signals to control gates of thin film transistors of the LCD.

As shown in FIG. 1, height of layout spent by the output buffer region 10 is H1, and height of layout spent by the level shifter region 12 is H2. Thus, height of layout added both is H1+H2. However, such vertically stacking layout occupies too much layout area, which does not conform to the trend of minimizing layout area the industries pursue, and thus needs to be improved.

SUMMARY OF THE INVENTION

It is therefore a primary objective of the claimed invention to provide a gate driving circuit for minimizing layout area and reducing cost.

The present invention discloses a gate driving circuit, which comprises a first output buffer unit region, a level shifter region and a low voltage circuit region. The first output buffer unit region is formed on a plane for setting a first output buffer unit. The level shifter region is formed on the plane for setting a level shifter, and aligned in a horizontal direction of the plane with the first output buffer unit region. The low voltage circuit region is formed on the plane for setting a low voltage circuit, located beneath the level shifter region and the first output buffer unit region, and aligned in a vertical direction of the plane with the level shifter region.

The present invention further discloses a gate driving circuit, which comprises a first output buffer unit region, a level shifter region and a low voltage circuit region. The first output buffer unit region is formed on a plane for setting a first output buffer unit. The level shifter region is formed on the plane for setting a level shifter, and includes a vertical region and a horizontal region connected to the vertical region. The vertical region and the first output buffer unit region are aligned in a horizontal direction of the plane. The horizontal region is located beneath the vertical region and the first output buffer unit region. The low voltage circuit region is formed on the plane for setting a low voltage circuit, located beneath the horizontal region, and aligned in a vertical direction of the plane with the horizontal region.

These and other objectives of the present invention will no doubt become obvious to those of ordinary skill in the art after reading the following detailed description of the preferred embodiment that is illustrated in the various figures and drawings.

DETAILED DESCRIPTION

Figures 1, 2:
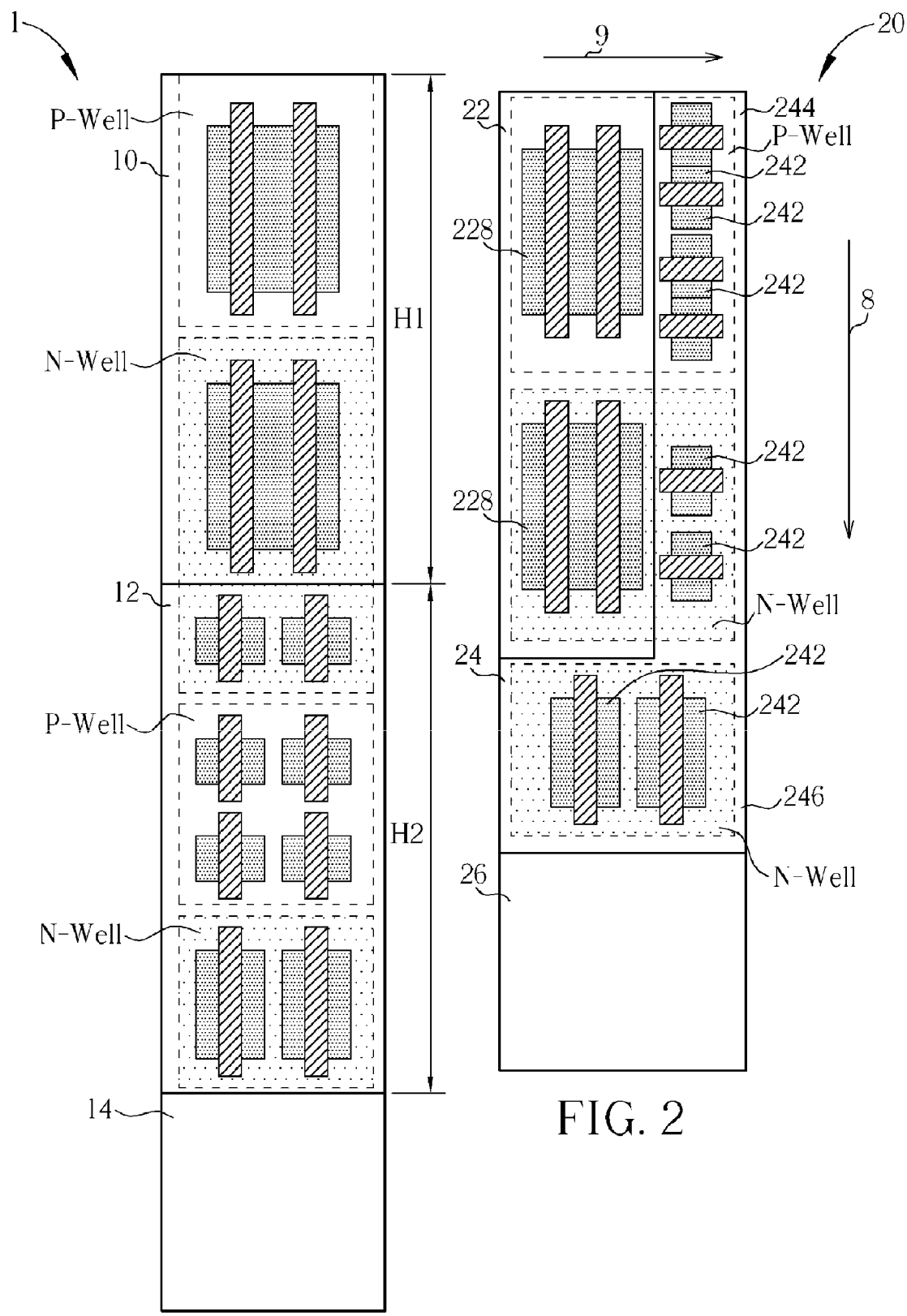
FIG. 1 is a schematic diagram of a single channel layout of a gate driver chip according to the prior art.
FIG. 2 is a schematic diagram of a single channel layout of a gate driving circuit according to an embodiment of the present invention.

Please refer to FIG. 2, which is a schematic diagram of a single channel layout 20 of a gate driving circuit according to an embodiment of the present invention. The gate driving circuit is utilized for driving thin film transistors of a LCD, and is implemented with an integrated circuit. The gate driving circuit comprises a first output buffer unit region 22, a level shifter region 24 and a low voltage circuit region 26.

The first output buffer unit region 22 is formed on a plane, which is not shown in FIG. 2, and is utilized for setting a first output buffer unit 228. The level shifter region 24 is formed on the plane for setting a level shifter 242, and includes a vertical region 244 and a horizontal region 246 connected to the vertical region 244. The vertical region 244 and the first output buffer unit region 22 are aligned in a horizontal direction of the plane, which is the direction indicated by the arrow 9. The horizontal region 246 is located beneath the vertical region 244 and the first output buffer unit region 22. The low voltage circuit region 26 is formed on the plane for setting a low voltage circuit, and is located beneath the horizontal region 246. The low voltage circuit region 26 and the horizontal region 246 are aligned in a vertical direction of the plane, which is the direction indicated by the arrow 8.

As shown in FIG. 2, since the level shifter 242 and the first output buffer unit 228 are both high-voltage devices, a portion circuit of the level shifter 242 located in the vertical region 244 can share an N-Well or a P-Well with the first output buffer unit 228. In this way, area of the single channel layout 20 can be reduced, and cost thereof can be cut down as well. Compared to the prior art in FIG. 1, in the present invention, height of layout of the first output buffer unit region 22 and the level shifter region 24 is less than H1+H2, thus causing area of the gate driving circuit to be reduced.

Figure 3:
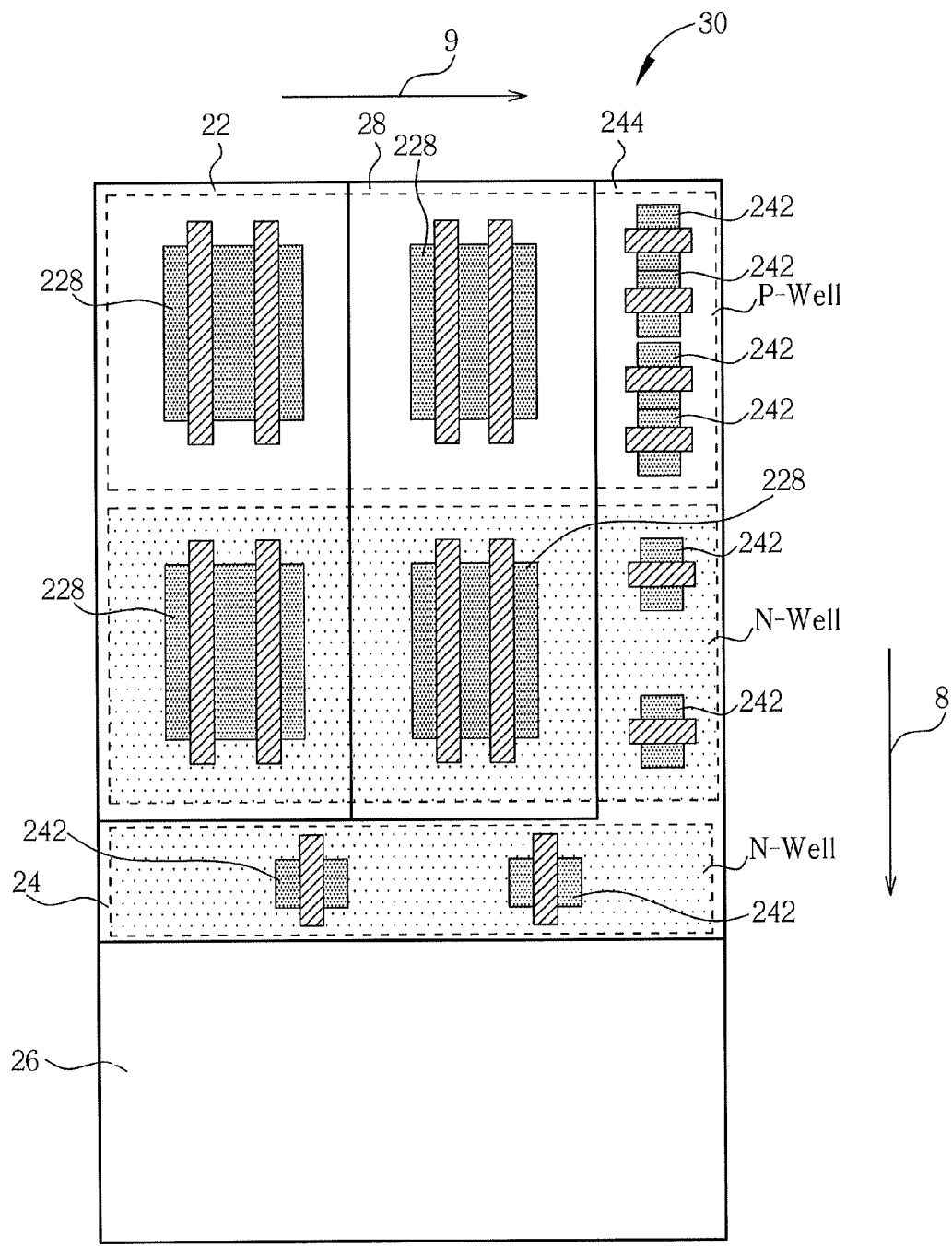
FIG. 3 is a schematic diagram of a double-channel layout of a gate driving circuit according to an embodiment of the present.
Figure 4:
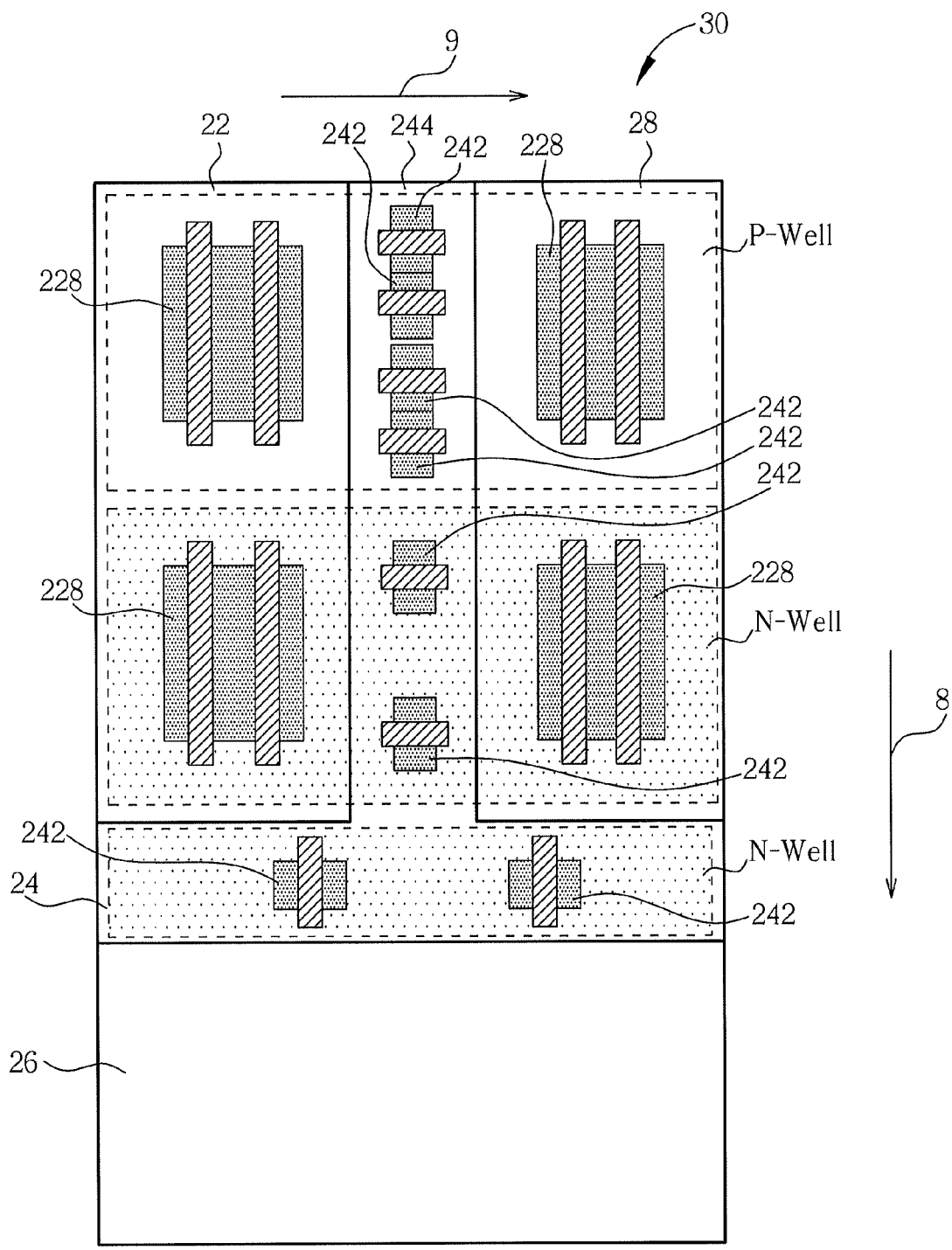
FIG. 4 is a schematic diagram of another exemplary embodiment of a double-channel layout of a gate driving circuit.

Please refer to FIG. 3, which is a schematic diagram of a double-channel layout 30 of a gate driving circuit according to an embodiment of the present. What is different from FIG. 2 is, the gate driving circuit shown in FIG. 3 further comprises a second output buffer unit region 28. The second output buffer unit region 28 is formed on the plane for setting a second output buffer unit, and is aligned in the horizontal direction with the first output buffer unit region 22 and the vertical region 244. Correspondingly, the level shifter 242 now comprises a first level shifter unit for being coupled to the first output buffer unit and a second level shifter unit for being coupled to the second output buffer unit. Moreover, in FIG. 3, the second output buffer unit region 28 is located between the first output buffer unit region 22 and the vertical region 244. However, that can be modified as shown in FIG. 4, which illustrates that the vertical region 244 is located between the first output buffer unit region 22 and the second output buffer unit region 28.

Figure 5:
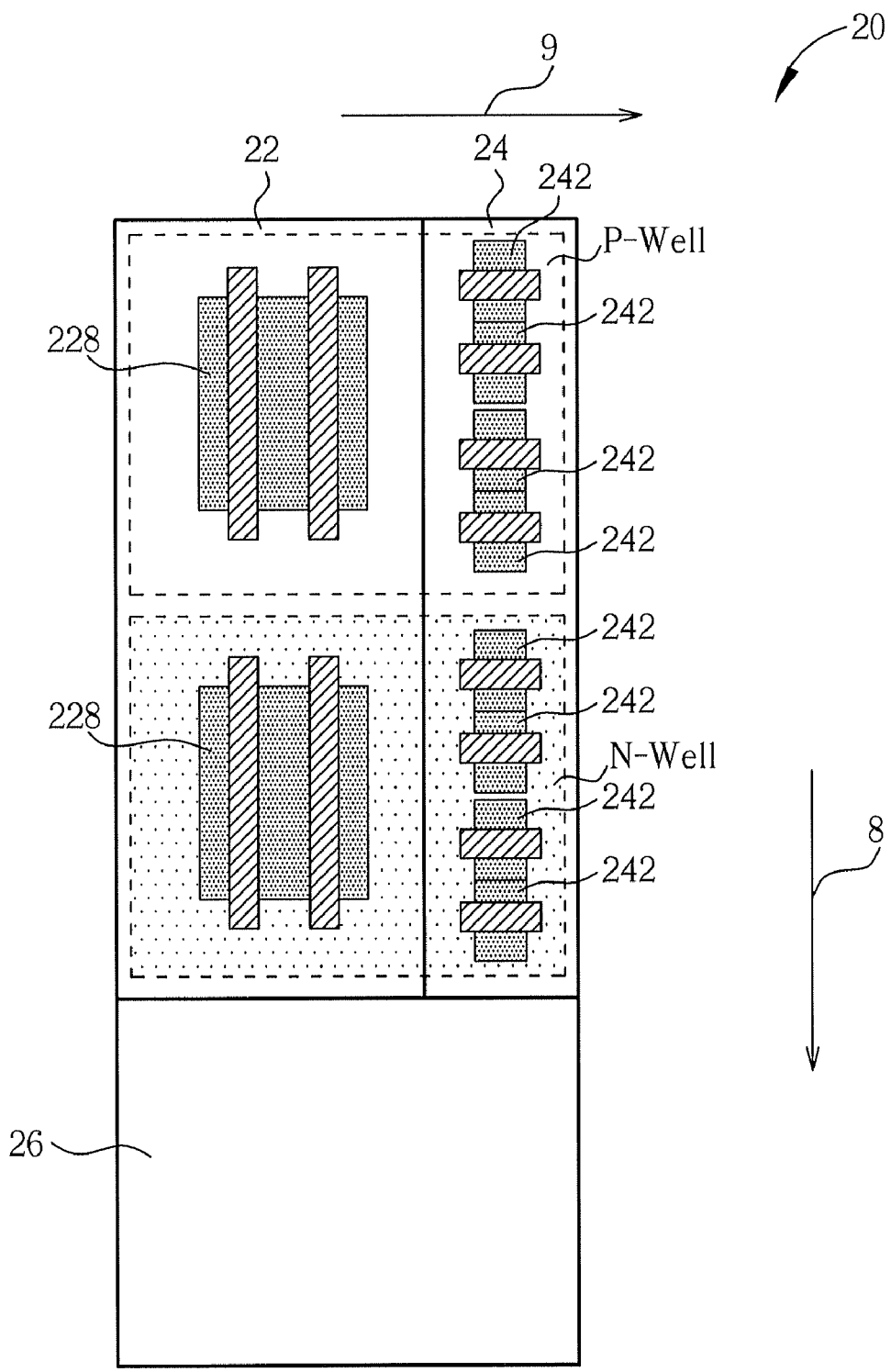
FIG. 5 is a schematic diagram of a single channel layout modified from FIG. 2.
Figure 6:
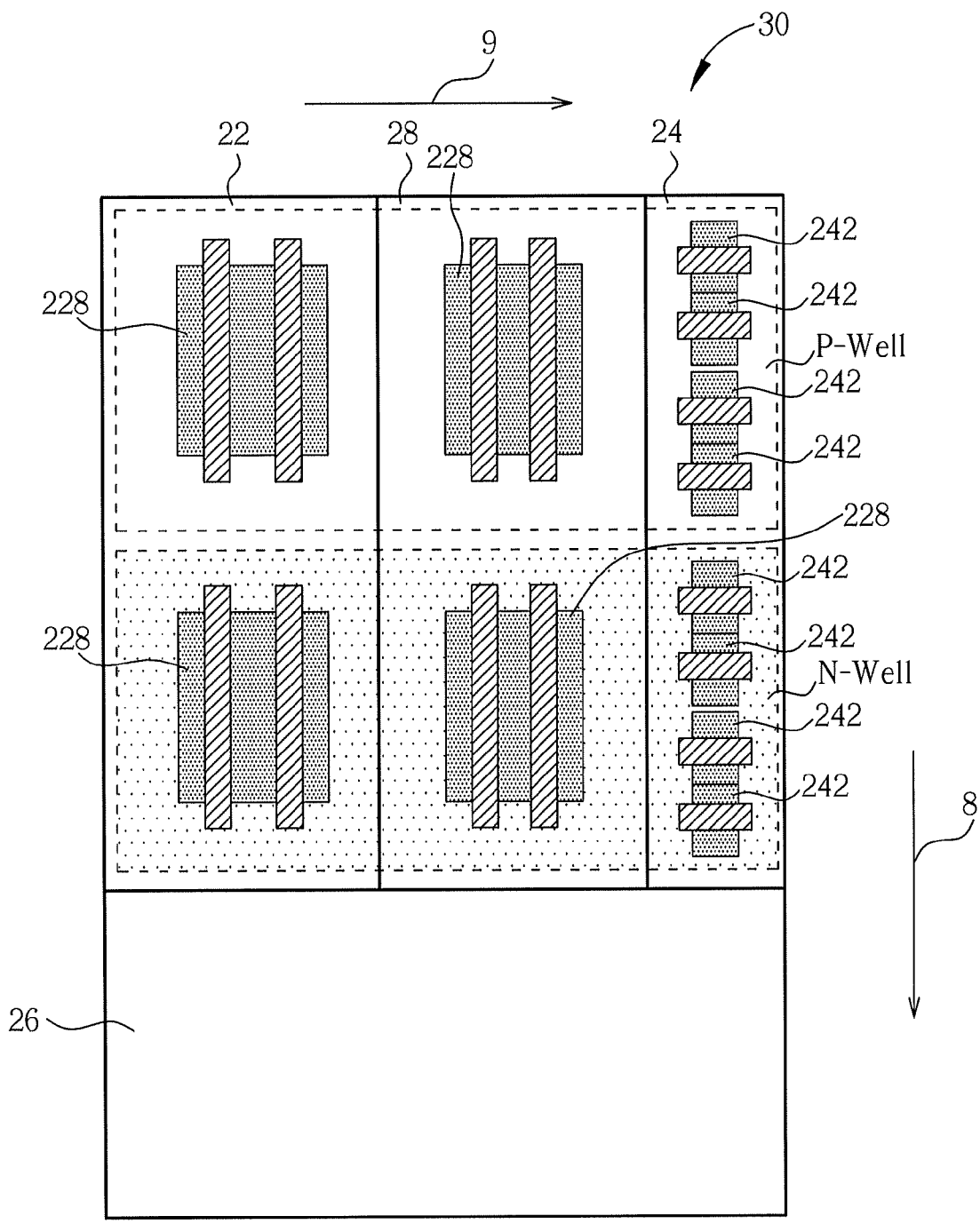
FIG. 6 is a schematic diagram of a double-channel layout modified from FIG. 3.
Figure 7:
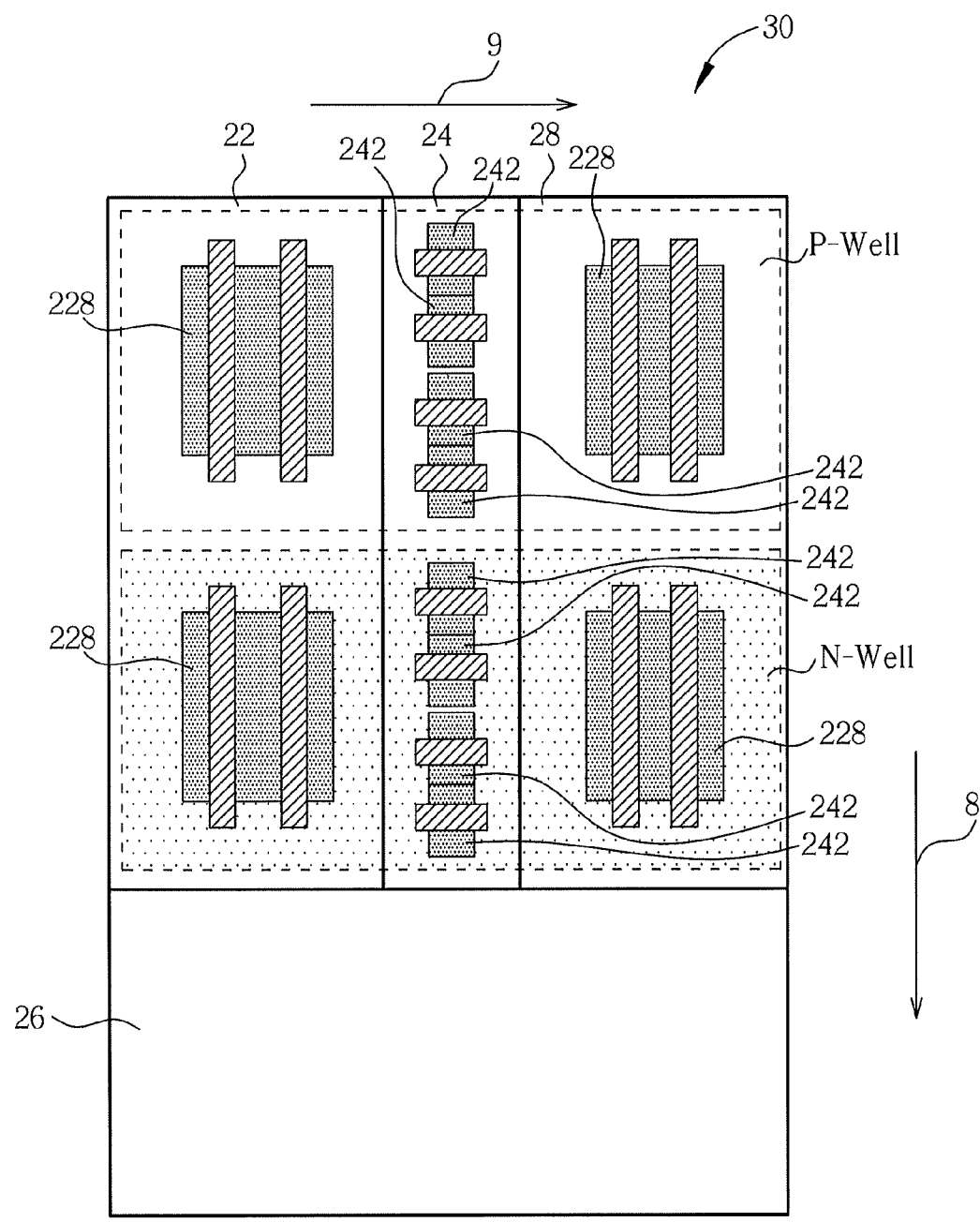
FIG. 7 is a schematic diagram of a double-channel layout modified from FIG. 4.

Please refer to FIG. 5, which is modified from FIG. 2. In FIG. 5, the horizontal region 246 originally shown in FIG. 2 has disappeared, because it is now integrated into the vertical region 244. In other words, the level shifter region 24 and the first output buffer unit region 22 are now aligned in the horizontal direction. The low voltage circuit region 26 is located beneath the level shifter region 24 and the first output buffer unit region 22, and is aligned in the vertical direction with the level shifter region 24. Like FIG. 5 modified from FIG. 2, in the same way, FIG. 6 can be modified from FIG. 3, and FIG. 7 can be modified from FIG. 4.

Please note that, descriptions hereinbefore only take the single channel layout 20 and the double-channel layout 30 of the gate driving circuit for example, and those skilled in the art can make alternations and modifications accordingly. For example, a four-channel layout or more channel layout can be implemented with the spirit of the present invention.

In conclusion, in the present invention, the level shifter and the first output buffer unit can share an N-Well or a P-Well. Thus, area of layout can be reduced, and cost thereof can be cut down as well.

Those skilled in the art will readily observe that numerous modifications and alterations of the device and method may be made while retaining the teachings of the invention.

What is claimed is:

1. A gate driving circuit comprising:
   a first output buffer unit region formed on a plane for setting a first output buffer unit;
   a level shifter region formed on the plane for setting a level shifter and aligned in a horizontal direction of the plane with the first output buffer unit region;
   a low voltage circuit region formed on the plane for setting a low voltage circuit, located beneath the level shifter region and the first output buffer unit region, and aligned in a vertical direction of the plane with the level shifter region; and
   a second output buffer unit region formed on the plane for setting a second output buffer unit and aligned in the horizontal direction with the first output buffer unit region and the level shifter region.

2. The gate driving circuit of claim 1, wherein the first output buffer unit and the level shifter share an N-Well.

3. The gate driving circuit of claim 1, wherein the first output buffer unit and the level shifter share a P-Well.

4. The gate driving circuit of claim 1, wherein the second output buffer unit region is located between the first output buffer unit region and the level shifter region.

5. The gate driving circuit of claim 4, wherein the level shifter comprises a first level shifter unit coupled to the first output buffer unit and a second level shifter unit coupled to the second output buffer unit.

6. The gate driving circuit of claim 1, wherein the level shifter region is located between the first output buffer unit region and the second output buffer unit region.

7. The gate driving circuit of claim 6, wherein the level shifter comprises a first level shifter unit coupled to the first output buffer unit and a second level shifter unit coupled to the second output buffer unit.

8. A gate driving circuit comprising:
   a first output buffer unit region formed on a plane for setting a first output buffer unit;
   a level shifter region formed on the plane for setting a level shifter, and including a vertical region and a horizontal region connected to the vertical region, the vertical region and the first output buffer unit region aligned in a horizontal direction of the plane, the horizontal region located beneath the vertical region and the first output buffer unit region;
   a low voltage circuit region formed on the plane for setting a low voltage circuit, located beneath the horizontal region, and aligned in a vertical direction of the plane with the horizontal region; and
   a second output buffer unit region formed on the plane for setting a second output buffer unit and aligned in the horizontal direction with the first output buffer unit region and the vertical region.

9. The gate driving circuit of claim 8, wherein the first output buffer unit and the level shifter share an N-Well.

10. The gate driving circuit of claim 8, wherein the first output buffer unit and the level shifter share a P-Well.

11. The gate driving circuit of claim 8, wherein the second output buffer unit region is located between the first output buffer unit region and the vertical region.

12. The gate driving circuit of claim 11, wherein the level shifter comprises a first level shifter unit coupled to the first output buffer unit and a second level shifter unit coupled to the second output buffer unit.

13. The gate driving circuit of claim 8, wherein the vertical region is located between the first output buffer unit region and the second output buffer unit region.

14. The gate driving circuit of claim 13, wherein the level shifter comprises a first level shifter unit coupled to the first output buffer unit and a second level shifter unit coupled to the second output buffer unit.

* * * * *